United States Patent [19]

Takemoto et al.

[11] Patent Number: 5,333,292
[45] Date of Patent: Jul. 26, 1994

[54] MICROCOMPUTER FOR SELECTIVELY ACCESSING NON-VOLATILE MEMORY AND OTHER STORAGE UNIT IN RESPONSE TO ALLOCATED ADDRESS INPUTS

[75] Inventors: Emiko Takemoto; Yoshikazu Satou, both of Hyogo, Japan

[73] Assignee: Mitsubishi Denki Kabushiki Kaisha, Tokyo, Japan

[21] Appl. No.: 683,222

[22] Filed: Apr. 10, 1991

[30] Foreign Application Priority Data

Jul. 13, 1990 [JP] Japan .................. 2-185627

[51] Int. Cl.⁵ .................................. G06F 12/00
[52] U.S. Cl. .................... 395/425; 364/DIG. 1; 364/254; 364/957; 395/400
[58] Field of Search ... 364/200 MS File, 900 MS File; 395/400, 425

[56] References Cited

U.S. PATENT DOCUMENTS

| | | | |
|---|---|---|---|
| 4,712,177 | 12/1987 | Schrenk | 235/380 |
| 4,713,756 | 12/1987 | Mackiewicz et al. | 365/228 |
| 4,720,812 | 1/1988 | Kao et al. | 395/700 |
| 4,791,603 | 12/1988 | Henry | 395/800 |
| 5,055,999 | 10/1991 | Frank et al. | 395/425 |
| 5,097,445 | 3/1992 | Yamauchi | 365/195 |
| 5,168,559 | 12/1992 | Tamura | 395/425 |
| 5,222,226 | 6/1993 | Yamaguchi et al. | 395/425 |

FOREIGN PATENT DOCUMENTS 27298 1/1990 Japan .

OTHER PUBLICATIONS

Mano, Computer System Architecture, 2nd edition, 1982, pp. 403-473 and pp. 478-517.
"Microprocessor Applications Manual" Motorola Semiconductor Prods., Inc. 1975, pp. 4-62 to 4-69.

Primary Examiner—Joseph L. Dixon
Assistant Examiner—Matthew M. Kim

[57] ABSTRACT

A microcomputer which is desired to be small and light-weight comprises an EPROM for storing an operation program for the microcomputer, a selection circuit which opens a gate connected to the ERPOM through the input of an address allocated to the EPROM, and another selection circuit which opens a gate connected to a circuit for storing a fixed value through the input of another address, thus eliminating a verification error which often occurs at the time of writing a program into the EPROM.

2 Claims, 3 Drawing Sheets

MICROCOMPUTER FOR SELECTIVELY ACCESSING NON-VOLATILE MEMORY AND OTHER STORAGE UNIT IN RESPONSE TO ALLOCATED ADDRESS INPUTS

BACKGROUND OF THE INVENTION

1. Field of the Invention

The present invention relates to a microcomputer having a rewritable involatile memory.

2. Description of the Prior Art

FIG. 3 shows the configurations of a microcomputer having a conventional EPROM (erasable programmable read-only memory), a rewritable involatile memory and its peripherals. In the figure, numeral 1 is a central processing unit (CPU), 2 internal bus, 3 RAM for storing data, 4 ROM, 5 EPROM, 6c buffer gate, 7 control line, 8 output bus and 9 microcomputer. The microcomputer 9 is connected to a programmer 11 and a host computer 12 via an external bus 10 for initialization. The programmer 11 comprises a RAM 13 which consists of a program area 14 for storing data and an unused empty area 15 having no data.

The EPROM 5 stores an operation program for the CPU 1 and the RAM 3 retains data in process of operation. The programmer 11 is used to write programs into the EPROM 5 and the programs are supplied from the host computer 12 as occasion demands. When the capacity of the RAM 13 of programmer 11 is 32 K bytes, for instance, the capacity of the EPROM 5 is 16 K bytes. Generally speaking, the RAM 13 is two times or more the capacity of the EPROM 5. This is because the built-in EPROM 5 is molded as small as possible in order to reduce the size and weight of the microcomputer 9.

The programmer 11 stores created programs (or programs supplied from the host computer 12) in the internal RAM 13 and write them into the EPROM 5 of the microcomputer 9.

A blank check is first made on the EPROM 5 as a preliminary step toward the processing of this writing. Then, actual writing is carried out. Finally, a verification check is made to see whether programs are written into EPROM 5 or not. Before writing, the contents of the EPROM 5 are "FF", which is verified by the blank check. The contents of the EPROM 5 before writing and after old programs are erased are always "FF".

The EPROM 5, an involatile memory, generally changes its internal memory data from "1" to "0" for writing, but cannot change from "0" to "1". "FF" of the EPROM 5 means that all area bit data are set (blank=possible to write).

After the blank check, the programmer 11 writes program data stored in the RAM 13 into the EPROM 5, At this time, an address must be set so as to write data stored in the program area 14 of the RAM 13 into the EPROM 5.

After all data stored in the program area 14 are written into the EPROM 5, a verification check is made to see if data within the program area 14 coincide with data within the EPROM 5. When they do not coincide with each other, an error occurs, and accordingly, a fail stop is given to the microcomputer.

In the example of FIG. 3, data are written into the EPROM 5 in 256 mode by the programmer 11 with a memory capacity of 32 K bytes, two times that of the RAM.

In the address area of this programmer 11, program data within the program area 14 with an address of OH to 3FFFH are set so as to write the data into the EPROM 5 for a verification check.

The conventional microcomputer 9 has such a drawback that when the programmer 11 might read the empty area 15 of the RAM 13 and compare the read data with the contents of the EPROM 5 at the time of a verification check before writing data into the EPROM 5, the two data do not coincide with each other and the output of microcomputer becomes unstable, resulting in a fail stop.

That is, the contents of the empty area 15 of the RAM 13 are all "FF", while the contents of the EPROM 5 are program data and not always "FF". Accordingly, these two data sometimes do not coincide with each other, thus causing an error.

To prevent area setting errors, it is always necessary to set the programmer 11 so that writing processing (blank check, writing and verification check) is conducted only for the program area 14 of the RAM 13. The specification of the program area (part) of the RAM 13 requires an extra program, which has been difficult for the microcomputer 9 because of size limitations.

SUMMARY OF THE INVENTION

It is therefore an object of the invention to eliminate the need for the programmer 11 to set a specific partial area of the RAM 13, simplify the writing processing of the RAM 13 into the small-capacity EPROM 5, and enable users to identify the contents of programs very easily.

According to the invention, the microcomputer 9 comprises a recording area selection circuit which outputs a detection signal through the input of an address allocated to the built-in EPROM 5, and an empty area selection circuit which outputs the other detection signal through the input of other addresses.

The above and other objects, features, and advantages of the invention will become more apparent from the following description when taken in conjunction with the accompanying drawings.

DESCRIPTION OF THE PREFERRED EMBODIMENT

The invention will be described in detail, referring to FIG. 1.

Figure 1:
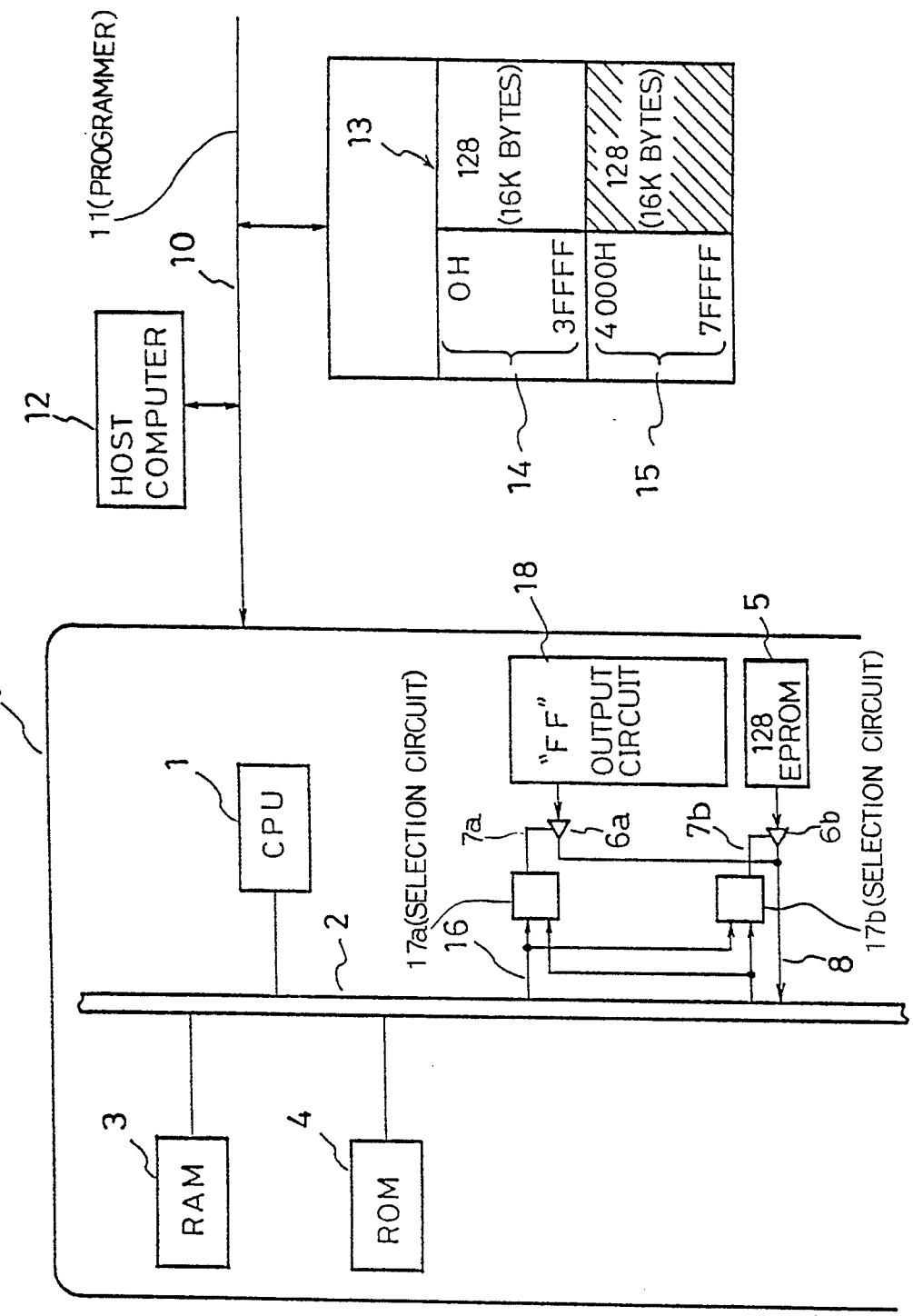
FIG. 1 a conceptional diagram of a microcomputer and its peripherals according to an embodiment of the invention.

In FIG. 1, numeral 1 is a central processing unit (CPU), 2 internal bus, 3 RAM for storing data, 4 ROM, 5 EPROM, 6a and 6b are buffer gates, 7a and 7b control lines, 8 output bus, 9 microcomputer, 16 address information line, 17a empty area selection circuit which outputs a signal to turn on the buffer gate 6a upon the reading of the address of the empty area, and 17b recording area selection circuit which outputs a signal to turn on the buffer gate 6b upon the reading of an address allocated to the EPROM area (program area). Numeral 18 is an "FF" output circuit which outputs data "FF" to the bus when 6a is turned on. Numeral 10 indicates an external bus, 11 programmer, 12 host computer 13 RAM within the programmer 11, 14 program area and 15 empty area.

The capacity of the EPROM 5 is generally made as small as possible to reduce the size and weight of the microcomputer 9. In this case, the external programmer 11 which writes programs into this EPROM 5 is not subject to size limitations, and accordingly, its RAM 13 has a relatively large capacity. Therefore, addresses allocated to the RAM 13 consist of addresses allocated to the small capacity EPROM 5 and the addresses of wide areas. The recording area selection circuit 17b outputs a detection signal through the input of an address allocated to the EPROM 5, while the empty area selection circuit 17a outputs the other detection signal through the input of other addresses. The same address allocated to the EPROM 5 is allocated to part of the memory area of the RAM 13 of the programmer 11. In this embodiment, lower addresses of 0000H to 3FFFH are allocated to the EPROM 5 and the RAM 13 has the same address area as the EPROM. An area with an address from 0000H to 3FFFH within the RAM 13 is the recording (program) area 14.

The operation of the microcomputer will be described next.

For the writing processing into the EPROM 5, a blank check is made on the EPROM 5 and actual writing is conducted. Finally, a verification check is made to see if data are written properly. The purpose of the verification check is to see if programs in the program area 14 within the RAM 13 of the programmer 11 are transferred to the EPROM 5 accurately. The CPU 1 is used to check if the contents of the program area and the EPROM 5 coincide with each other. When the CPU 1 reads data in the program area 14 within the RAM 13 of the programmer 11, the address signal is given to the selection circuits 17a and 17b via the address information line 16.

The recording area selection circuit 17b outputs a control signal via the control line 7b to turn on the buffer gate 6b. Then, a program stored in the ERPOM 5 is read and compared with the contents of the program area 14 of the programmer 11. Unless a special error occurs, these values coincide with each other and a verification check is completed with the output of a stable signal.

When the CPU 1 reads the empty area 15 within the RAM 13 of the programmer 11, this address signal is also given to the selection circuits 17a and 17b via the address information line 16. Then, the empty area selection circuit 17a outputs a control signal via the control line 7a to turn on the buffer gate 6a. "FF", the contents of the "FF" output circuit 18 is read and compared with the value of the empty area 15 within the programmer 11. Since the contents of empty area 15 are all "FF", these values coincide with each other and a verification check is completed with the output of a stable signal.

In this manner, in case that the capacity of the RAM 13 of the programmer 11 is larger than that of the ERPOM 5, a fail stop does not occur and a program is written into the EPROM 5 stably. Therefore, there is no need to specify the program area 14 within the RAM 13 and to provide an extra program and an additional circuit for the specification.

Figure 2:
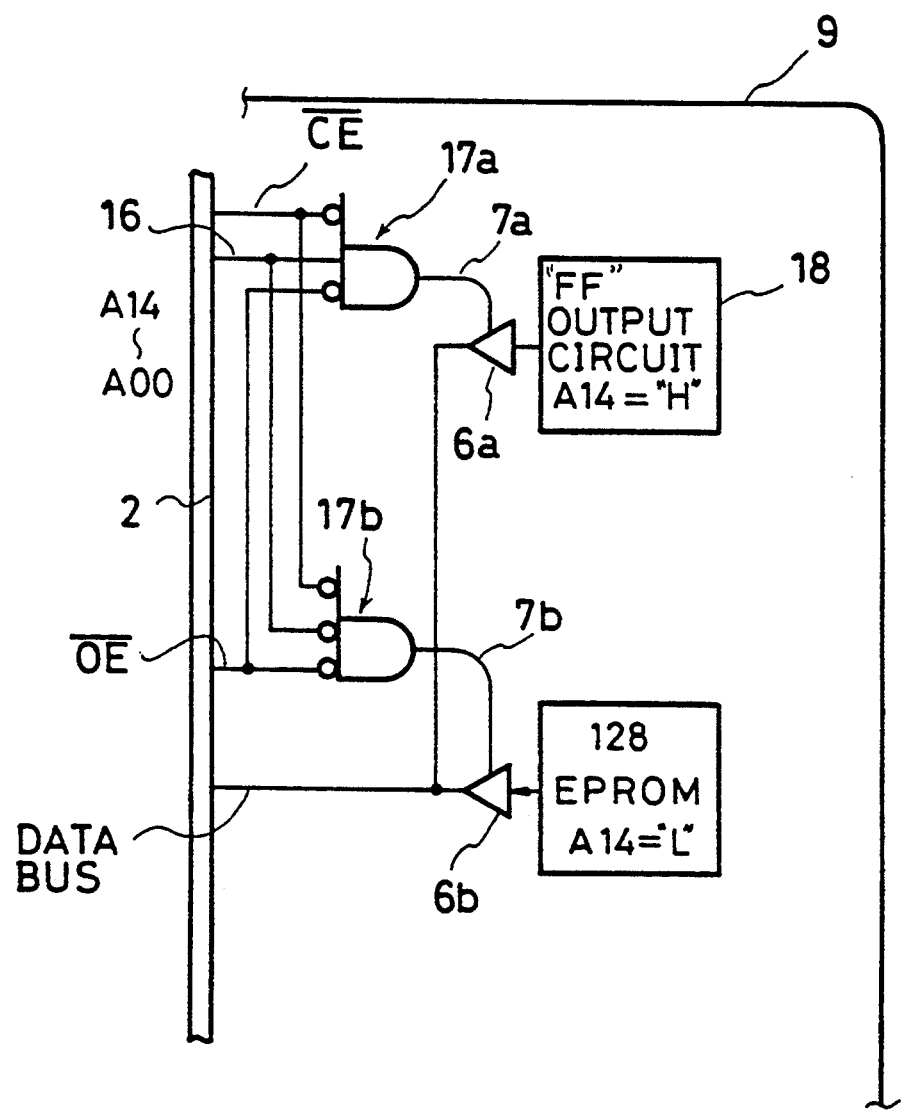
FIG. 2 is a diagram showing an example of an area selection circuit.
Figure 3:
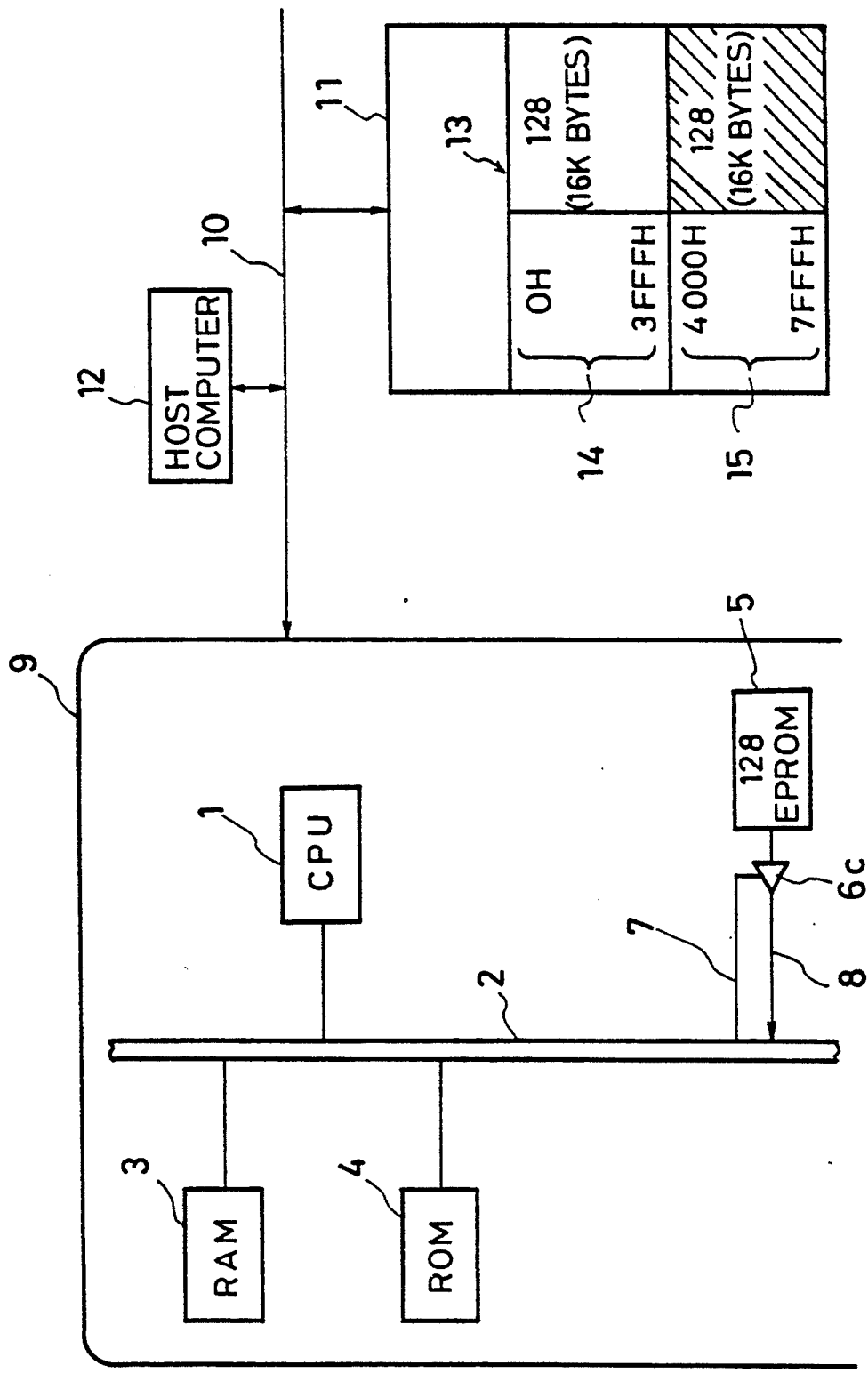
FIG. 3 is a conceptional diagram of a conventional microcomputer and its peripherals.

The empty area selection circuit 17a and the recording area selection circuit 17b are such that they can output an signal to identify the both areas. For instance, as shown in FIG. 2, a partial NOR circuit may constitute the empty area selection circuit 17a, while a three-input NOR circuit may constitute the recording area selection circuit 17b, and address signals A 14 to A00 may be given to the address information line 16 so as to identify the both areas with chip enable $\overline{CE}$ and output enable $\overline{OE}$. As for the "FF" output circuit, a circuit having the above function other than the circuit of this embodiment obtains the effects of the invention. In place of the ERPOM, other involatile memories may be used. A three-state buffer gate can be used as a buffer gate.

According to the invention, when a programmer without an exclusive writing mode is used to read an empty area for the processing of writing, "FF" is output. This eliminates the occurrence of a verification error and simplifies writing processing. In case that the capacity of a memory built into a microcomputer is smaller than that of a programmer, there is no need to specify a program area for a programmer.

What is claimed is:

1. A microcomputer that simplifies verifying a plurality of bytes of program data downloaded to a rewritable non-volatile memory in said microcomputer from a memory programmer coupled to said microcomputer by an external data bus, said memory programmer including a memory unit having a first plurality of storage locations, said first plurality of storage locations including a program subset of storage locations for storing said program data with each storage location of said program subset of storage locations storing one of said bytes of said program data, wherein said rewritable non-volatile memory has a memory address space having a second plurality of storage locations for storing said downloaded program data, each second storage location storing a byte of said downloaded program data that corresponds to one of said bytes of program data stored in a unique one of said program subset storage locations, said microcomputer comprising:

value outputting means for outputting a fixed value byte;

an address line for carrying an address signal; and output selecting means, coupled to said address line, to said rewritable non-volatile memory, and to said value outputting means, for inputting said address signal and outputting one of said bytes of said downloaded program data from a location in said rewritable non-volatile memory corresponding to a location addressed by said address signal when said address signal corresponds to a location in said memory address space and for outputting said fixed value byte from said value outputting means when said address signal corresponds to a location outside said memory address space, so that said byte of downloaded program data and said fixed byte value output from said output selecting means can be used by the memory programmer to verify that the downloaded program data stored in said rewritable non-volatile memory matches the program data stored in the memory unit of the memory programmer.

2. The microcomputer of claim 9 wherein said output selecting means comprises:

a first gate circuit coupled to said erasable involatile memory, for outputting said bytes of downloaded program data from said erasable programmable involatile memory when enabled;

a second gate circuit coupled to said value outputting means, for outputting said fixed value bytes from said value outputting means when enabled;

a first selection circuit, coupled to said address line and to said first gate circuit, for enabling said first gate circuit when said address signal corresponds to a location in said memory address space;

a second selection circuit, coupled to said address line and to said second gate circuit, for enabling said second gate circuit when said address signal corresponds to a location outside said memory address space.

* * * * *